United States Patent [19]

Leger et al.

[11] Patent Number: 5,357,199
[45] Date of Patent: Oct. 18, 1994

[54] SLAVED RADIO FREQUENCY FIELD AND LIGHT POLARIZATION MAGNETOMETER

[75] Inventors: Jean-Michel Leger, Meylan; Jean Crescini, Domene; Christophe Guttin, Virieu, all of France

[73] Assignee: Commissariat a l'Energie Atomique, France

[21] Appl. No.: 89,289

[22] Filed: Jul. 8, 1993

[30] Foreign Application Priority Data

Jul. 16, 1992 [FR] France ................ 92 08783

[51] Int. Cl.[5] .................................. G01R 33/24
[52] U.S. Cl. ................................ 324/301; 324/300
[58] Field of Search ............ 324/300, 301, 302, 318, 324/322, 314

[56] References Cited

U.S. PATENT DOCUMENTS

| | | | |
|---|---|---|---|
| 3,629,697 | 12/1971 | Bouchiat et al. | 324/301 |
| 3,715,654 | 2/1973 | Scarzello | 324/301 |
| 4,327,327 | 4/1982 | Greenwood et al. | 324/304 |
| 4,812,753 | 3/1989 | Fuderer et al. | 324/318 |
| 5,221,897 | 6/1993 | Duret et al. | 324/301 |

FOREIGN PATENT DOCUMENTS 0288927 11/1988 European Pat. Off. .
0461999 12/1991 European Pat. Off. .

OTHER PUBLICATIONS

Revue De Physique Appliquee, vol. 5, No. 1 "Progres Recents sur le Magnetometre a Vapeur de Cesium Type Asservi" by Meilleroux pp. 121–130.

Optics Communications 81 (1991) Mar. 15, No. 6, Amsterdam, NL "4HE optical pumping with polarization modulated light" by: Gilles, et al pp. 369–374.

Primary Examiner—Kenneth A. Wieder
Assistant Examiner—Raymond Y. Mah
Attorney, Agent, or Firm—Hayes, Soloway, Hennessey, Grossman & Hage

[57] ABSTRACT

Slaved radio frequency field and light polarization magnetometer. The polarization direction (P) is slaved perpendicular to the field (Bo) to be measured, as well as the radio frequency field (Brf). Application to the measurement of weak magnetic fields such as the geomagnetic field.

4 Claims, 6 Drawing Sheets

SLAVED RADIO FREQUENCY FIELD AND LIGHT POLARIZATION MAGNETOMETER

DESCRIPTION

1. Technical Field

The object of the invention is a slaved radio frequency field and light polarization magnetometer. It is used in the precise measurement of weak magnetic fields (typically in the range 20 to 70 $\mu$T corresponding to the values of the geomagnetic field.

2. Prior Art

The magnetometer according to the invention falls within the category of resonance magnetometers and a general description thereof is contained in the article by F. HARTMAN entitled "Resonance Magnetometers", published in the Journal IEEE Transactions on Magnetics, vol. MAG-8, no. 1, March 1972, pp. 66–75.

A resonance magnetometer is an apparatus which, immersed in a magnetic field Bo, supplies an electric signal of frequency F, whose value is linked with Bo by the so-called LARMOR relation:

$$F = \gamma Bo$$

in which $\gamma$ is a gyromagnetic ratio of an electron or nucleon, as a function of the substance used. For example, for the electron said ratio is equal to 28 Hz/nT.

The excitation of the magnetic resonance is obtained by a winding around the substance used. The sampling of the resonance signal takes place either by another winding (electrical variant) or by an optical or light pumping beam (optical variant).

The description which will now be described relates to the second variant.

FR-A-2 663 430 describes an optical pumping magnetometer diagrammatically shown in FIG. 1. An at least partly transparent cell 10 is filled with a gas 12, generally helium, at a pressure of 1 to a few Torrs. A light source 14 supplies a light beam 15, whose wavelength is approximately 1.1 $\mu$m. This beam traverses a linear polarizer 16. The resulting polarized beam 17 traverses the cell 10 and emerges in the form of a beam 18.

Moreover, a so-called weak or gentle radio frequency discharge is produced in the gas 12 by a generator 30 connected to two electrodes 32, 33 arranged around the cell 10. This discharge produces atoms in a metastable state ($2^3S_1$ in the case of helium). The incident light beam 17 "pumps" these atoms from the metastable state and brings them into another excited state ($2^3P$).

In the presence of a magnetic field Bo, the energy levels are subdivided into so-called ZEEMAN sublevels. A resonance between such sublevels can be established by a radio frequency field.

This resonance is revealed by various known means and whereof one variant is shown in FIG. 1. It is a winding 20 located on either side of the cell 10 (in a so-called HELMHOLTZ arrangement), a radio frequency generator 22, a photodetector 24 receiving the emergent light radiation 18, an amplifier 25 connected to the photodetector 24, a synchronous detector 21 receiving a reference signal from the generator 22 and an integrator 23.

The generator 22 supplies the winding 20 with current at the frequency F, which creates a magnetic oscillating field, whereof one component maintains the resonance and on the return path modulates the light beam 18 which has passed through the cell 10. This modulation occurs again in the electric signal supplied by the photodetector 24 and detected by the synchronous detector 21. The signal supplied by the synchronous detector 21 has a component in phase with the reference signal and said component serves as an error signal. The integrator 23 eliminates the static error therefrom. This error signal adjusts the frequency F of the frequency generator 22 so as to cancel out the error signal. Therefore this generator is therefore voltage controllable. It can e.g. be a voltage controlled oscillator or V.C.O.

An electric resonance signal is therefore established in this loop and this signal is at the LARMOR frequency. A frequency meter 26 gives the value F thereof. The field Bo to be measured is deduced therefrom by the relation $Bo = F/\gamma$.

Magnetometers of this type were firstly used in helium lamps. The recent obtaining of lanthanum-neodymium aluminate (or LNA) crystals have made it possible to produce lasers tunable around the wavelength of 1.083 $\mu$m precisely corresponding to the optical pumping line of helium. Therefore this type of laser has naturally been substituted for these lamps leading to a significant performance improvement, so that interest in such magnetometers has been reawakened.

Such a magnetometer equipped with a LNA laser is described in FR-A-2 598 518.

Although satisfactory in certain respects, these magnetometers still suffer from disadvantages. Thus, as a result of their principle they are highly anisotropic and this occurs both in amplitude and in frequency. These anisotropies are either consequences of the optical pumping cycle and the detection of the transmitted light intensity, or are linked with the optical resonance phenomenon.

The already mentioned FR-A-2 663 430 proposes a solution to this problem consisting of providing the magnetometer with means making it possible to rotate the linear polarization direction of the light beam 17 injected into the cell 10 in order to give it the optimum direction corresponding to a maximum amplitude of the resonance signal.

Several means can be used for determining and obtaining this optimum direction. In a first variant, the magnetometer comprises a directional magnetometer, such as e.g. an array of three flux gates or an electron paramagnetic resonance or EPR magnetometer in order to obtain information on the direction of the ambient field to be measured. A circuit for processing this information calculates the optimum orientation of the polarization and as a consequence thereof controls the rotation of the polarizer.

In a second variant, the magnetometer comprises means for the low frequency modulation of the polarization direction and for carrying out a synchronous detection of the resonance signal. The detected signal serves as an error signal for correcting the polarization and giving it the optimum direction.

Although satisfactory in certain respects, these solutions suffer from the disadvantage of complexity, particularly in the variant having associated flux gates. The polarization modulation variant also suffers from the disadvantage of reducing the pass band of the magnetometer, because the maximum analysis frequency is necessarily below the modulation frequency.

DESCRIPTION OF THE INVENTION

The present invention aims at obviating these disadvantages. To this end it provides a magnetometer without anisotropy of frequency or amplitude and which does not use a modulation of the light polarization or the associated directional magnetometers. This result is obtained by directionally slaving the polarization of the incident light beam in a direction perpendicular to the ambient magnetic field Bo to be measured and simultaneously directionally slaving the radio frequency magnetic field parallel to the polarization direction. In other words, the polarization direction and that of the radio frequency field are both oriented in the same optimum direction, no matter what the direction of the magnetic field to be measured.

More specifically, the present invention relates to an optical pumping and resonance magnetometer incorporating a cell filled with a gas, whose atoms have a gyromagnetic ratio, said cell being immersed in an ambient magnetic field Bo, which is the field to be measured, a light source emitting a light beam, a linear polarizer traversed by said beam and giving said beam a linear polarization in accordance with a first direction, the linearly polarized beam then traversing the cell, a photodetector receiving the light beam which has traversed the cell, said photoreceiver supplying an electric signal, means for applying a radio frequency field to said cell, said field having a second direction and a certain frequency, means for making this frequency dependent on the LARMOR frequency $F=\gamma Bo$, a means for measuring said frequency, the amplitude of the ambient magnetic field Bo being deducted from the frequency F by the relation $Bo=F/\gamma$, said magnetometer being characterized in that it also comprises first slaving means acting on the first direction, which is that of the polarization of the light beam, in order to regulate said first direction to 90° of the direction of the ambient magnetic field Bo, said first means incorporating a first synchronous detection circuit receiving the electric signal supplied by the photodetector and a reference voltage at the frequency F of the radio frequency signal, said circuit detecting the amplitude of the phase quadrature component with the reference signal, said amplitude being used for controlling means for rotating the polarization direction until said amplitude is zero, the first direction then being slaved perpendicular to the ambient magnetic field and second slaving means acting on the second direction, which is that of the radio frequency field, in order to make said second direction coincide with the first.

Preferably, the means for controlling the direction of the radio frequency field incorporate two windings having orthogonal axes and means for supplying these windings by two currents having the same frequency dependent on the LARMOR frequency and two appropriately weighted amplitudes. These weighted amplitudes can be obtained by an angular position detector of the polarizer.

DETAILED DESCRIPTION OF AN EMBODIMENT

Figure 1:
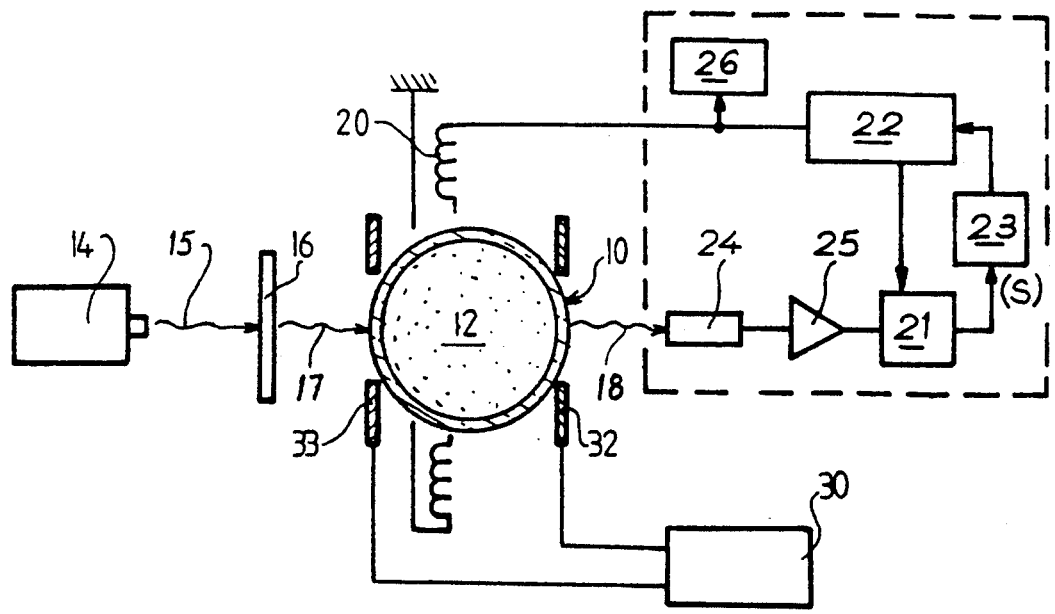
FIG. 1 already described, shows a prior art magnetometer.
Figure 2:
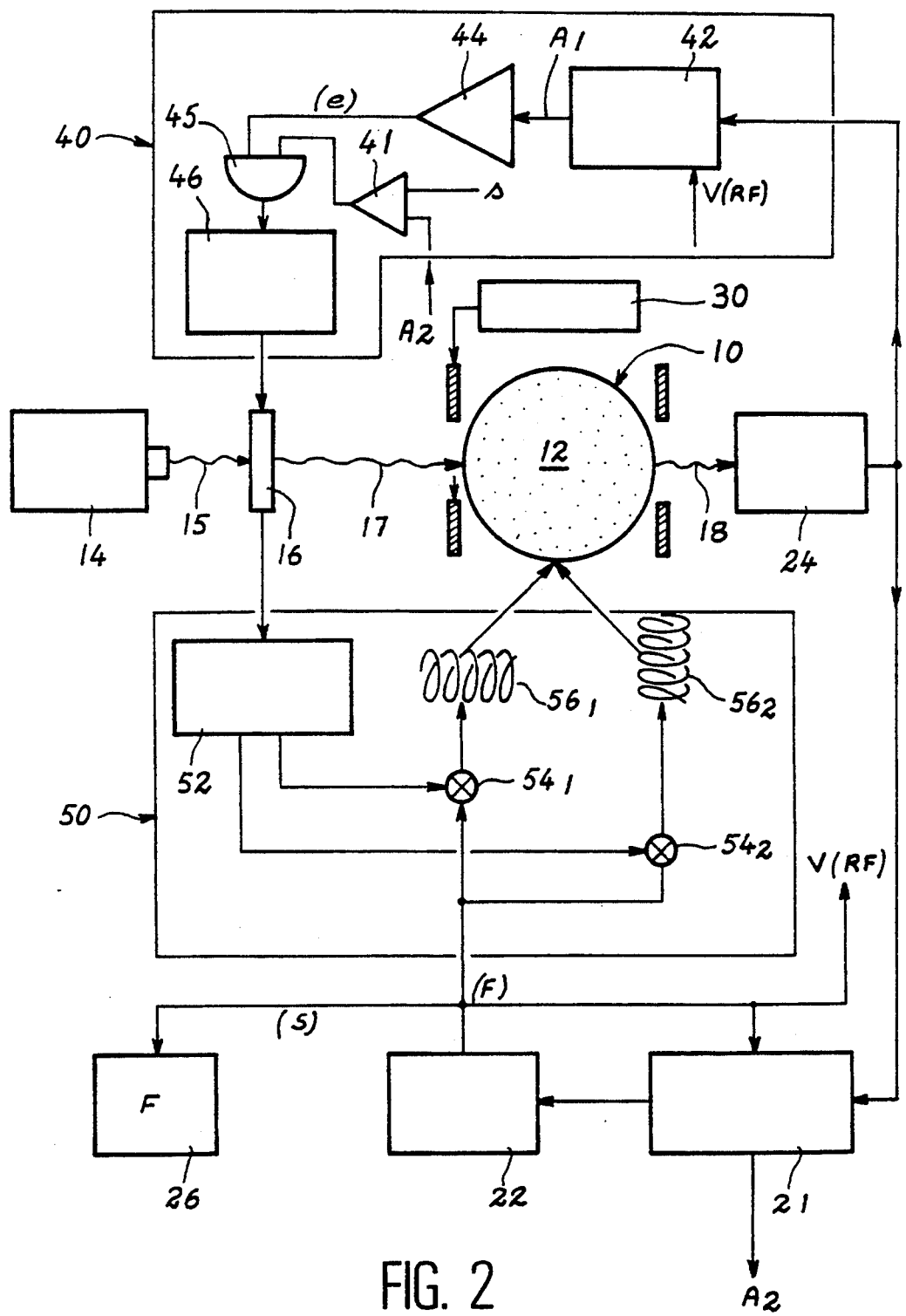
FIG. 2 illustrates a magnetometer according to the invention.

The magnetometer shown in FIG. 2 comprises means already shown in FIG. 1 and which for this reason carry the same references. They are the cell 10 filled with gas 12, the laser 14 emitting a beam 15, the polarizer 16 supplying a linear polarized beam 17, the photodetector 24 receiving the emerging beam 18, the frequency slaving circuit 21, the radio frequency generator 22, the frequency meter 26 and the discharge circuit 30. It is pointed out that the frequency slaving of the magnetometer can be obtained either from a continuous signal or a signal with a frequency double the LARMOR frequency, as will become more clear in conjunction with FIGS. 4a to 4d.

The magnetometer shown also comprises two direction slaving circuits, the first 40 acting on the polarizer 16 and the second 50 controlling the radio frequency field direction.

The first slaving circuit 40 comprises a first synchronous detection circuit 42 receiving the electric signal supplied by the photodetector 24 and a reference voltage $V_{RF}$ from the generator 22. This circuit 42 detects the amplitude $A_1$ of the component in phase quadrature with the reference signal $V_{RF}$. For reasons which will become more clear in conjunction with FIG. 4d, said amplitude $A_1$ serves as the error signal which, once amplified by an amplifier 44, supplies a motor 46 which rotates the polarizer 16 in a direction such that the error signal is cancelled out.

The second slaving circuit 50 incorporates a polarization angle detector 52, which supplies two signals proportional to $\cos \theta$ and $\sin \theta$, if $\theta$ is the angle by which the polarization direction of the incident beam 17 is rotated, two multipliers $54_1$, $54_2$ receiving on the one hand said signals and on the other the radio frequency signal supplied by the generator 22. The outputs of the two multipliers are connected to two windings $56_1$, $56_2$ with orthogonal axes, as will be described in conjunction with FIG. 5.

Figure 3:
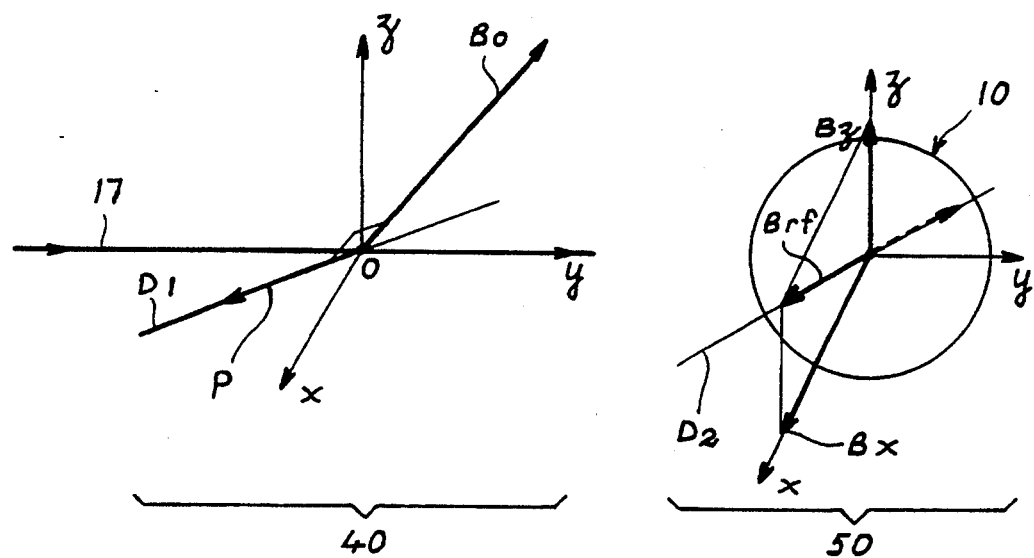
FIG. 3 is a diagram showing various directions implied in the invention.

FIG. 3 makes it possible to illustrate the functions fulfilled by the two slaving means of circuits 40 and 50. The directions are referenced relative to a trirectangular axis system Oxyz. The light beam 17 is propagated along the axis Oy. The linear polarization P of said beam is therefore in the plane xOz. The ambient magnetic field Bo is directed in a random direction. Therefore the function of the slaving circuit 40 is to give the polarization P the direction $D_1$ perpendicular to Bo.

With regards to the radio frequency field Brf, whose direction is $D_2$, it is a question of orienting it parallel to $D_1$. For this purpose to the two components Bx and Bz of said field are given appropriate values (the component along Oy being zero), so that the composition of these components gives a field having the desired direction $D_2$.

It should be observed that no matter what the direction of Bo, there is always a direction of the plane xOz which is perpendicular to Bo. Thus, it is certain that during the complete rotation of the polarizer 16, the polarization direction P will pass through a position at 90° from Bo. Thus, the minimum angle formed by Bo with a line of the plane xOz is equal to $(\pi/2)-\theta n$, if $\theta n$ designates the angle formed by the perpendicular to the plane xOz (in other words the axis Oy) with the field Bo, the maximum angle being equal to $(\pi/2)+n$. During a polarizer rotation of 36°, the angle formed by the polarization direction P with Bo would therefore vary between $(\pi/2)-\theta n$ and $(\pi/2)+\theta n$ and will necessarily pass through $\pi/2$.

Figure 4A:
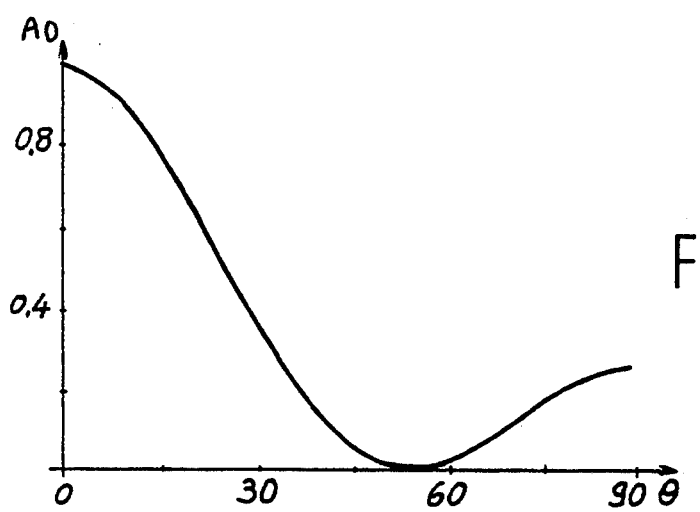
FIGS. 4a, 4b, 4c, 4d show the variations of the amplitude of the various signals as a function of the angle formed by the polarization direction with the ambient magnetic field.

FIGS. 4a to 4d show the variations of certain signals as a function of the angle $\theta$ formed by the polarization direction with the direction of the magnetic field to be measured Bo. In FIG. 4a, the amplitude $A_0$ is the amplitude of the continuous component of the signal, said component being $(3\cos^2\theta-1)^2$. This component is zero for an angle of approximately 54°. It is maximum for $\theta=90°$ and 0° (if $\theta$ is 90° this can always be obtained as explained hereinbefore, which is not always the case for 0°, which can only be reached if Bo is in the plane xOz).

Figure 4B:
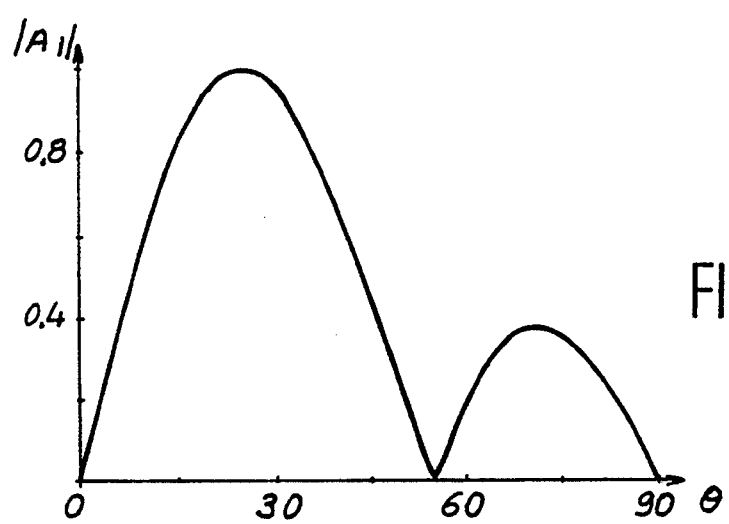

FIG. 4b shows the absolute value $|A_1|$ of the amplitude of the component at the LARMOR frequency and in phase quadrature with the radio frequency signal. This component is $|\sin 2\theta (3\cos^2\theta-1)|$. It is cancelled out for $\theta=0$ and 90° and also for 54°.

Figure 4C:
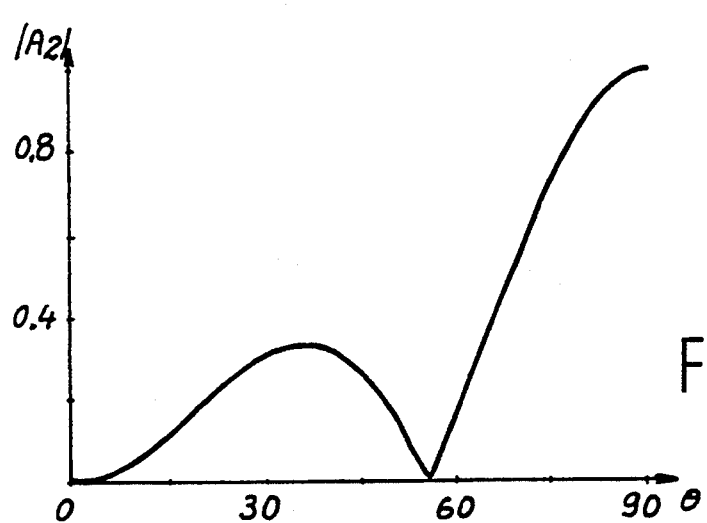

FIG. 4c shows the absolute value of the amplitude $A_2$ of the component at the frequency double the LARMOR frequency, said component being $\sin^2\theta |(1-3\cos^2\theta)|$. It is cancelled out for $\theta=0$ and 54° and passes through a maximum for $\theta=90°$.

Figure 4D:
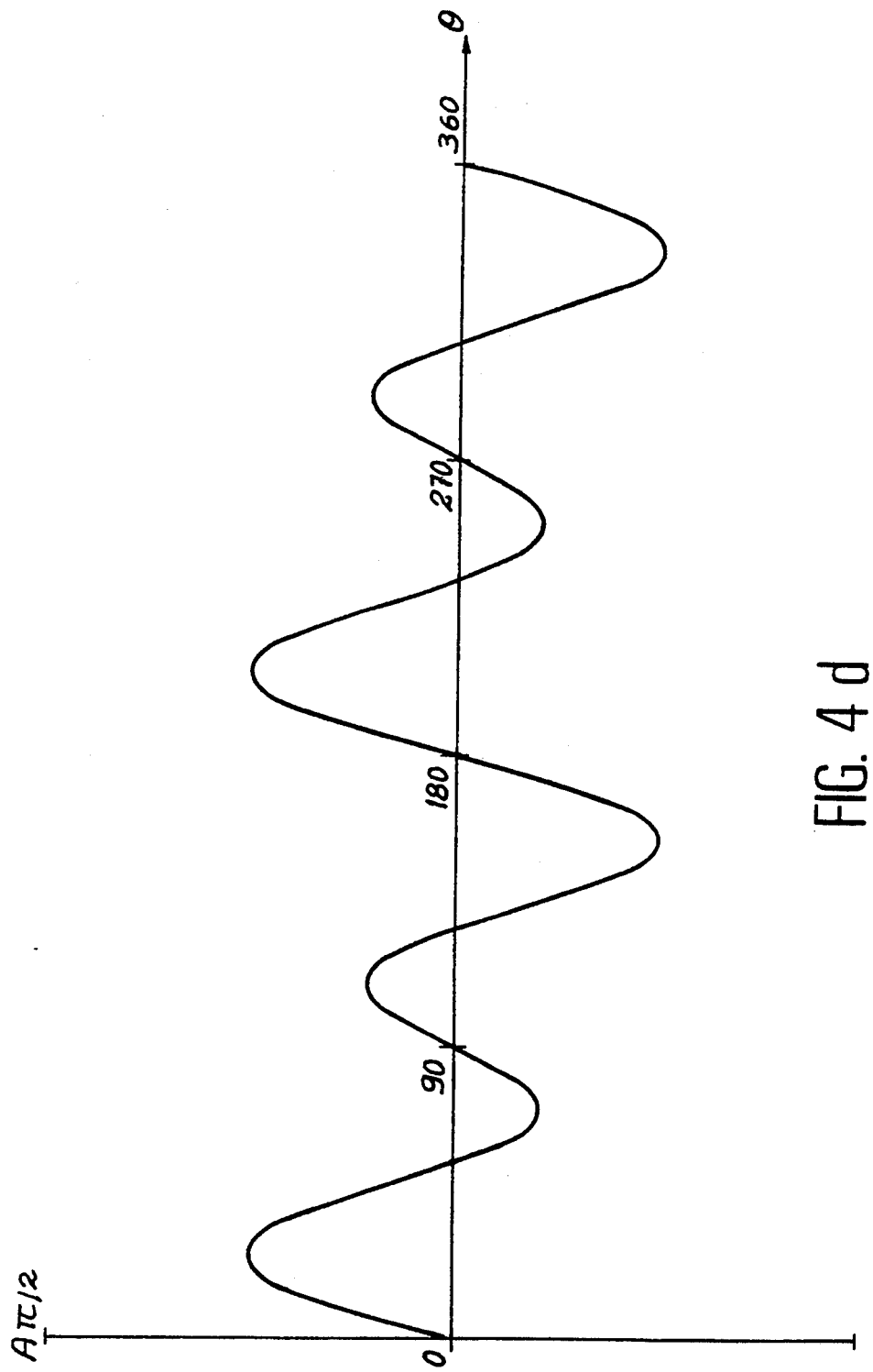

Finally, FIG. 4d shows the amplitude $A_1$, in quantity and sign, which is the slaving signal.

It can be seen that the signal $A_1$ at the LARMOR frequency, by its cancelling out and its sign change for $\theta=90°$, constitutes a convenient error signal making it possible to obtain a slaving of the polarization direction at 90° of the field Bo. However, this signal is also cancelled out for the angle 0° and 54°, so that there is a risk of the polarization direction being fixed or coupled on these inopportune values. To avoid this risk, use is jointly made of the fact that the double frequency signal (FIG. 4c) has a maximum for $\theta=90°$, which makes it possible to distinguish this value from the two others (0° and 54°), where $A_2$ is zero. It is not necessary to ensure that the signal $A_2$ is at a maximum. It is sufficient to check that it is not zero, i.e. in practice that it exceeds a certain threshold.

Therefore polarization slaving takes place by checking that two conditions are simultaneously satisfied, namely that $A_1$ is zero and that $A_2$ exceeds a certain threshold. This double function is ensured in the circuit 40, e.g. by a comparator 41, which compares $A_2$ with a threshold s and a logic AND gate 45, which only supplies a control signal for the motor 46 if $A_2$ exceeds the threshold.

This property of the double frequency signal can only be used on starting up the magnetometer for coupling the polarization P with the value 90°. Then, if the field Bo changes direction, the polarization will remain slaved on the correct direction.

On using the double frequency signal, it is advantageous to utilize said same signal for the frequency slaving of the magnetometer by means 21 which control the generator 22. The circuit 21 can supply a signal reflecting the amplitude $A_2$ of the double frequency component, intended for the comparator 41, which will exploit this information for validating the error signal $A_1$.

The fact of using a phase sensitive detection makes the system dependent on all phenomena other than the relative direction of the polarization P with respect to the field Bo and which also affect the phase shift of the resonance signal. However, in magnetic resonance, a supplementary phase shift $\Delta\phi_\phi$ of the optical resonance signal relative to the excitation signal RF can appear as soon as the orientation of the polarizer varies with respect to that of the radio frequency field. In the least favourable case, a variation $\Delta\phi_\phi$ of the polarization orientation leads to a supplementary phase shift of the resonance signal. It is therefore readily apparent that there is a configuration for which the phase shift $\Delta\phi_\phi$ is equal to $\pi/2$ (to within $\pi$), the output of the synchronous detection also being cancelled out. Then, around this direction, there is a signal which cancels out and changes sign, so that the slaying can also be coupled to this operating point, independently of the value of $\theta_F$ for this configuration.

To overcome this difficulty, it is therefore appropriate to ensure that in no case does a random configuration make it possible to obtain a phase shift $\Delta\phi_\phi$ equal to $\pi/2$ (to within $\pi$). In practice, the radio frequency field direction is slaved in such a way that the field B1 is always parallel to P. Angles are then obtained with respect to Bo which are in both cases equal to $\pi/2$ and also the phase shift $\Delta\phi_\phi$ is constant (linked with the cable lengths for example), so that it can be chosen close to $\Delta\phi_\phi=0$. Thus, working takes place under optimum conditions for the chosen resonance detection mode.

Figure 5:
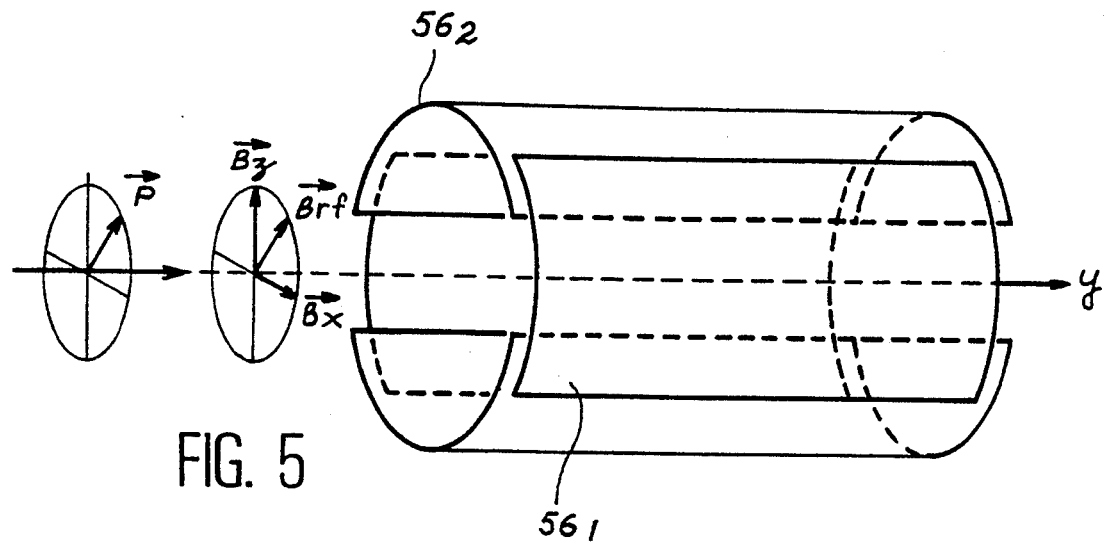
FIG. 5 shows two windings with orthogonal axes making it possible to obtain the radio frequency field with an appropriate direction.

For obtaining an oscillating field having a given direction in the plane perpendicular to the light beam propagation direction, around the cell are placed two sets of coils having orthogonal axes, as shown under $56_1$ and $56_2$ in FIG. 5. The axis of the coil $56_1$ is parallel to the axis Ox and creates a component Bx, whilst the axis of the coil $56_2$ is parallel to Oz and creates a component Bz.

It is then sufficient to control the currents passing through each of these coils in order to obtain a field RF having a given amplitude and direction. Assuming that the current/fileld transfer functions are identical for the coils $56_1$ and $56_2$ traversed respectively by the current $i_1$ and $i_2$, the direction of the oscillating field $B_{rf}$ will form an angle $\theta=\text{Arctg } i_2/i_1$ with the axis of the coil $56_1$ and will have the same amplitude as that which would be created by a coil arranged in this direction and traversed by a current $i=\sqrt{i_1^2+i_2^2}$. In the invention, it is wished to create a variable direction, constant amplitude field. For this purpose it is only necessary to inject currents weighted by $\cos\theta$ and $\sin\theta$, i.e. respectively $i_1=i\cos\theta$ and $i_2=i\sin\theta$, the angle $\theta$ being referenced with respect to the axis of the coil $56_1$ (Ox axis).

Figure 7:
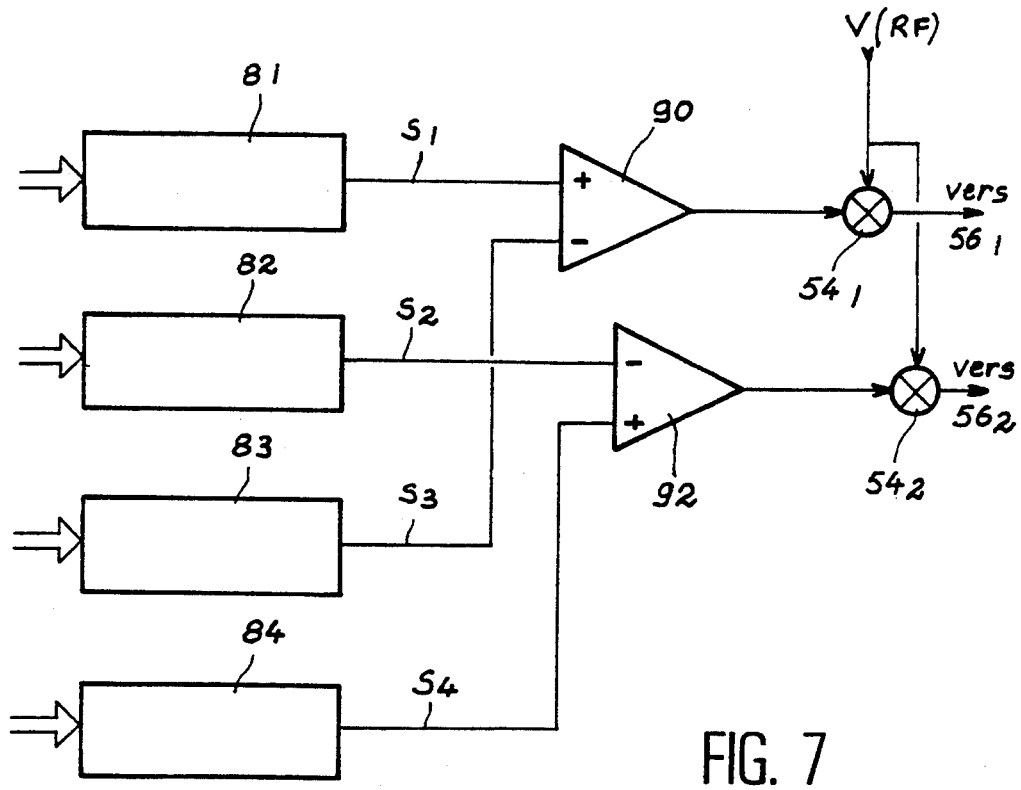
FIG. 7 shows a circuit for the formation of two supply currents for the two windings.
Figure 6:
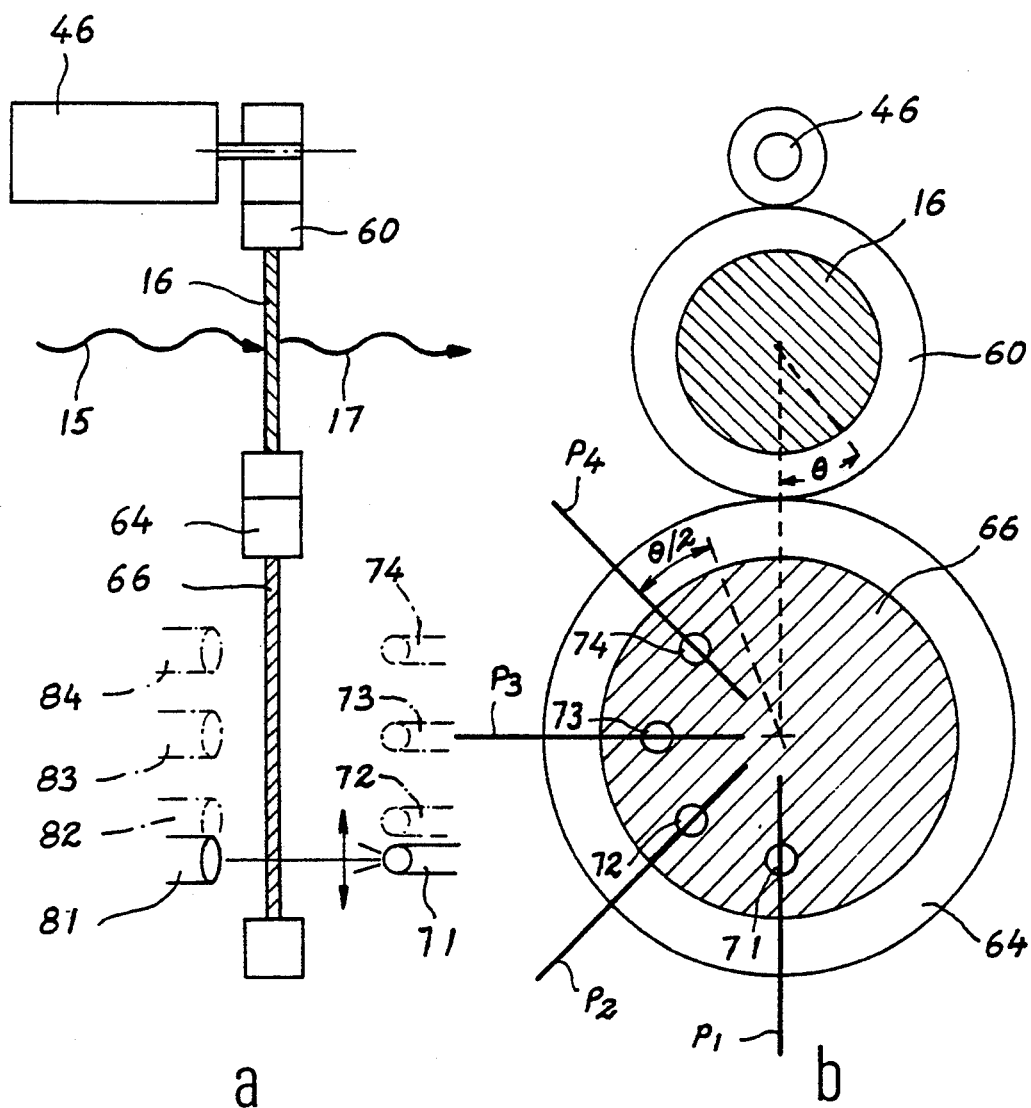
FIG. 6 shows an embodiment of the means making it possible to detect the polarization angle.

An embodiment of these means is shown in FIGS. 6 and 7.

FIG. 6 firstly shows (in side view a and front view b), the polarizer 16 fixed to a ring 62 controlled in rotation by a motor 46. It is also possible to see a second linear polarizer 66 fixed to a ring 64, which meshes with the ring 60. The diameter of these rings is in a ratio of 2, so that when the polarizer 16 rotates by an angle $\theta$, the polarizer 66 rotates by half the angle $\pi/2$. The apparatus shown also comprises four light sources 71, 72, 73, 74, e.g. light emitting diodes, respectively associated with four photodetectors 81, 82, 83, 84 across the second polarizer 66. These four sources 71, 72, 73, 74 are linearly polarized at 45° from one another in the directions P1, P2, P3, P4.

Means are provided for forming the difference between two signals supplied by the two photodetectors polarized at 90° from one another 81, 83 and 82, 84. These means are illustrated in FIG. 7 in the form of two subtractors 90, 92 respectively connected to the photodetectors 81, 83 and 82, 84.

If Sn is used to designate the signal supplied by a photodetector of order n (n=1 for 81, n=2 for 82, etc.) and $\theta'$ designates the rotation angle of the polarizer 66, we obtain:

$$Sn = I \cos^2 (\theta' + n(\pi/4))$$

or $$Sn = I/2 \; 1 + \sin (2\theta' + n(\pi/2))$$

so that as the angle $\theta'$ is equal to half $\theta$, we obtain $2\theta' = \theta$. If the differences formed between the signals supplied by the photodetectors 81, 83 on the one hand and 82, 84 on the other, we obtain at the output of the subtractors 90, 92, two signals equal to:

$$S_1 - S_3 = I/2 \; (\cos \theta - \cos (\theta + \pi)) \text{ i.e. } I \cos \theta$$

$$S_4 - S_2 = I/2 \; (\sin \theta - \sin (\theta + \pi)) \text{ i.e. } I \sin \theta.$$

These currents will be used for weighting the radio frequency signal $V_{RF}$ applied to the multipliers $54_1$ and $54_2$ in order to obtain appropriate excitation currents for the windings $56_1$ and $56_2$. Thus, an apparatus is obtained, which creates a field RF of given amplitude and direction dependent on that of the polarizer 16, which is also dependent or slaved in such a way that whatever the orientation of the sensor with respect to the static magnetic field Bo, the polarization direction angle with Bo is equal to $\pi/2$ (to within $\pi$). Thus, the magnetometer always functions in its optimum configuration.

We claim:

1. Optical pumping and resonance magnetometer incorporating a cell (10) filled with a gas (12), whose atoms have a gyromagnetic ratio ($\gamma$), said cell being immersed in an ambient magnetic field Bo, which is the field to be measured, a light source (14) emitting a light beam (15), a linear polarizer (16) traversed by said beam (15) and giving said beam a linear polarization in accordance with a first direction (D$_1$), the linearly polarized beam (17) then traversing the cell (10), a photodetector (24) receiving the light beam (18) which has traversed the cell (10), said photodetector (24) supplying an electric signal, means (20, 22) for applying a radio frequency field (B$_{rf}$) to said cell (10), said radio frequency field having a second direction (D$_2$) and a certain frequency, means (21, 22, 23) for making this frequency dependent on the LARMOR frequency F=$\gamma$Bo, a means (26) for measuring said frequency (F), the amplitude of the ambient magnetic field Bo being deducted from the frequency F by the relation Bo=F/$\gamma$, said magnetometer being characterized in that it also comprises first slaving means (40) acting on the first direction (D$_1$), which is that of the polarization of the light beam, in order to regulate said first direction to 90° of the direction of the ambient magnetic field Bo, said first means (40) incorporating a first synchronous detection circuit (42) receiving the electric signal supplied by the photodetector (24) and a reference (V$_{RF}$) voltage from the means for applying a radio frequency field (22) at the frequency F of the radio frequency signal, said circuit (42) outting the amplitude (A$_1$) in phase quadrature with the reference signal (V$_{RF}$), and said first slaving means (40) verifying that the amplitude (A$_2$) of the double frequency signal is not zero, the amplitude (A$_1$) of the component at the frequency (F) being used for controlling means for rotating the polarizer (16) in order to rotate the polarization direction (D$_1$) until said amplitude (A1) is zero, the first direction then being slaved perpendicular to the ambient magnetic field (Bo) and second slaving means (50) acting on the second direction (D$_2$), which is that of the radio frequency field (B$_{rf}$) in order to make said second direction (D$_2$) coincide with the first (D$_1$).

2. Magnetometer according to claim 1, characterized in that the means for controlling the direction (D$_2$) of the radio frequency field (B$_{rf}$) incorporate two windings (56$_1$, 56$_2$) having orthogonal axes and means (52, 54$_1$, 54$_2$) for supplying these windings by two currents having the same frequency dependent on the LARMOR frequency and two weighted amplitudes.

3. Magnetometer according to claim 2, characterized in that the currents at the weighted amplitudes are obtained by a detector (52) of the angular position of the polarizer (16).

4. Magnetometer according to claim 3, characterized in that the angular position detector (52) comprises a second linear polarizer (66) controlled by means for making it rotate by an angle ($\theta/2$) half the rotation angle ($\theta$) of the first polarizer (16), four light sources (71, 72, 73, 74) respectively associated with four photodetectors (81, 82, 83, 84) across the second polarizer (66), said four sources (71, 72, 73, 74) being polarized linearly at 45° of one another (P1, P2, P3, P4), means (90, 92) for forming the difference between two signals supplied by two photodetectors polarized at 90° of one another (81, 83; 82, 84), which gives the two amplitudes necessary for the weighting of the supply currents of the two windings (56$_1$, 56$_2$).

* * * * *

UNITED STATES PATENT AND TRADEMARK OFFICE
CERTIFICATE OF CORRECTION

PATENT NO. : 5,357,199

DATED : October 28, 1994

INVENTOR(S) : LEGER ET AL

It is certified that error appears in the above-identified patent and that said Letters Patent is hereby corrected as shown below:

Claim 1, Col. 8, Line 15, "outting" should be --outputting--

Signed and Sealed this

Third Day of January, 1995

Attest:

BRUCE LEHMAN

Attesting Officer

Commissioner of Patents and Trademarks